US010677864B2

(12) United States Patent
Lin et al.

(10) Patent No.: US 10,677,864 B2
(45) Date of Patent: Jun. 9, 2020

(54) TUNING/DETUNING CIRCUIT AND DETUNING METHOD FOR AN RF COIL

(71) Applicant: Siemens Healthcare GmbH, Erlangen (DE)

(72) Inventors: Hou Quan Lin, Shenzhen (CN); Ying Lun Wang, Shenzhen (CN); Wen Ming Li, Shenzhen (CN); JianMin Wang, Shenzhen (CN); Juergen Nistler, Erlangen (DE)

(73) Assignee: Siemens Healthcare GmbH, Erlangen (DE)

( * ) Notice: Subject to any disclaimer, the term of this patent is extended or adjusted under 35 U.S.C. 154(b) by 2 days.

(21) Appl. No.: 15/941,201

(22) Filed: Mar. 30, 2018

(65) Prior Publication Data

US 2018/0284203 A1     Oct. 4, 2018

(30) Foreign Application Priority Data

Mar. 31, 2017  (CN) .......................... 2017 1 0208680

(51) Int. Cl.
*G01V 3/00* (2006.01)
*G01R 33/36* (2006.01)
(Continued)

(52) U.S. Cl.
CPC ... *G01R 33/3628* (2013.01); *G01R 33/34076* (2013.01); *G01R 33/3657* (2013.01); *H03H 1/0007* (2013.01)

(58) Field of Classification Search
CPC .............. G01R 33/5608; G01R 33/543; G01R 33/3815; G01R 33/3804; A61B 5/055
(Continued)

(56) References Cited

U.S. PATENT DOCUMENTS 5,754,143 A  *  5/1998  Warnagiris ............... H01Q 1/36
                                                       343/746
2002/0179720 A1 * 12/2002 Liva ...................... H04M 3/005
                                                       235/492
(Continued)

FOREIGN PATENT DOCUMENTS

CN        1534305 A        10/2004
CN        1941500 A         4/2007
(Continued)

OTHER PUBLICATIONS

Office Action dated Jan. 6, 2020 for Chinese Patent Application No. 2017102208680.X.

*Primary Examiner* — Walter L Lindsay, Jr.
(74) *Attorney, Agent, or Firm* — Schiff Hardin LLP

(57) ABSTRACT

A tuning/detuning structure and a detuning method for an RF coil use an RF power source, a first impedance circuit, a first RF line, and a first port having a first guide leg end and a first input end, with the first guide leg end being connected to a first end ring capacitance of the RF coil. When the RF coil needs to be detuned, the first input end is connected to the first impedance circuit via the first RF line. When the RF coil needs to transmit an RF pulse signal, the first input end is connected to the RF power source via the first RF line. The need for a switch element is thereby reduced as is harm resulting from breakdown of such a switch element. An impedance circuit can be combined with a switch element to realize detuning jointly, and a good detuning effect can be achieved by a small number of switch elements.

5 Claims, 6 Drawing Sheets

(51) Int. Cl.
*H03H 1/00* (2006.01)
*G01R 33/34* (2006.01)

(58) Field of Classification Search
USPC .......................................................... 324/309
See application file for complete search history.

(56) References Cited

U.S. PATENT DOCUMENTS

| | | |
|---|---|---|
| 2003/0178997 A1* | 9/2003 | Eberler ............ G01R 33/34046 |
| | | 324/318 |
| 2005/0127914 A1 | 6/2005 | Eberler et al. |
| 2007/0085540 A1 | 4/2007 | Du |
| 2007/0296593 A1 | 12/2007 | Hall et al. |
| 2009/0076377 A1 | 3/2009 | Findekelee |
| 2010/0060283 A1* | 3/2010 | Findeklee ........ G01R 33/34007 |
| | | 324/318 |
| 2011/0309832 A1 | 12/2011 | Alagappan et al. |
| 2012/0081115 A1 | 4/2012 | Reykowski |
| 2014/0210475 A1 | 7/2014 | Li et al. |
| 2015/0032245 A1 | 1/2015 | Valcore, Jr. et al. |

FOREIGN PATENT DOCUMENTS

| | | |
|---|---|---|
| CN | 101427150 A | 5/2009 |
| CN | 101454685 A | 6/2009 |
| CN | 101501991 A | 8/2009 |
| CN | 101567670 A | 10/2009 |
| CN | 101819263 A | 9/2010 |
| CN | 102293649 A | 12/2011 |
| CN | 102803981 A | 11/2012 |
| CN | 103618139 A | 3/2014 |
| CN | 103969609 A | 8/2014 |
| CN | 105759230 A | 7/2016 |
| JP | H0980140 A | 3/1997 |

\* cited by examiner

701
When an RF coil needs to be detuned, removing a connection between a first input end of a first port and an RF power source, and retaining a connection between a first guide leg end of the first port and the RF coil.

702
Connecting the first input end of the first port to a first impedance circuit via a first RF line.

703
When the RF coil needs to transmit an RF pulse signal, removing the connection between the first input end of the first port and the first impedance circuit, and retaining the connection between the first guide leg end of the first port and the RF coil.

704
Cconnecting the first input end of the first port to the RF power source.

Fig. 7

TUNING/DETUNING CIRCUIT AND DETUNING METHOD FOR AN RF COIL

BACKGROUND OF THE INVENTION

Field of the Invention

The present invention relates to the technical field of magnetic resonance imaging, in particular to a tuning/detuning structure and a detuning method for a radio-frequency (RF) coil.

Description of the Prior Art

Magnetic resonance imaging (MRI) is an imaging technology involving biomagnetics and nuclear spin that has advanced rapidly with the development of computer technology, electronic circuit technology and superconductor technology. MRI uses a magnetic field and radio-frequency (RF) pulses to induce oscillation of precessing hydrogen nuclei (i.e. H+) in human tissue, to generate RF signals that are processed by a computer to form an image. If an object is placed in a magnetic field and irradiated by suitable electromagnetic waves to produce resonance therein, and electromagnetic waves produced thereby are then analyzed, it is possible to identify the positions and types of the atomic nuclei of which the object is composed. On this basis, a precise three-dimensional image of the interior of the object can be made. For instance, a moving picture of contiguous slices can be obtained by performing an MRI scan of the human brain, starting at the top of the head and continuing all the way to the foot.

In an MRI system, an RF coil transmits RF pulses to bring about magnetic resonance. A local coil receives a magnetic resonance signal, and sends the magnetic resonance signal to a receive coil channel selector (RCCS) and a receiver. As the front end of the signal reception chain, an RF coil plays a decisive role in imaging quality. Compared with other components, RF coils have the characteristics of being easy to develop and optimize, and for this reason have always been a focus of activity in the MRI research field. When the local coil receives the magnetic resonance signal, the RF coil must be set to a detuned state, to prevent interference to the signal receiving operation of the local coil.

In the prior art, some high-power diodes are added on rungs of the RF coil. When the local coil receives the magnetic resonance signal, the connection or cutoff of the high-power diodes is controlled by a control signal to change the electrical structure of the RF coil, thereby preventing undesirable resonance in the RF coil.

However, high-power diodes are expensive. In addition, frequent control of the high-power diodes by the control signal can result in breakdown of the high-power diodes.

SUMMARY OF THE INVENTION

An object of the present invention is to provide a tuning/detuning structure and a detuning method for an RF coil.

The present invention is an RF coil tuning/detuning circuit, having an RF power source, a first impedance circuit that is independent of the RF power source, a first RF line, a first port having a first guide leg end and a first input end, with the first guide leg end being connected to a first end ring capacitance of the RF coil, and when the RF coil needs to transmit an RF pulse signal, the first input end is connected to the RF power source via the first RF line, and when the RF coil needs to be detuned, the first input end is connected to the first impedance circuit via the first RF line.

In a further embodiment, the RF coil tuning/detuning circuit has a second RF line, a second impedance circuit, a second port having a second guide leg end and a second input end, with the second guide leg end being connected to a second end ring capacitance of the RF coil, and when the RF coil needs to transmit an RF pulse signal, the second input end is connected to the RF power source via the second RF line, and when the RF coil needs to be detuned, the second input end is connected to the second impedance circuit via the second RF line.

In another embodiment, the RF coil tuning/detuning circuit has a redundant RF line, a redundant impedance circuit, a redundant port having a redundant guide leg end and a redundant input end, and when the RF coil needs to be detuned, the redundant guide leg end is connected to a third end ring capacitance in the RF coil, and the redundant input end is connected to the redundant impedance circuit via the redundant RF line.

In another embodiment, the RF coil tuning/detuning circuit has the first impedance circuit and the first RF line form a first equivalent inductance, and the first equivalent inductance and the first end ring capacitance form resonance, so that the first end ring capacitance is in an open circuit state, or the second impedance circuit and the second RF line form a second equivalent inductance, and the second equivalent inductance and the second end ring capacitance form resonance, so that the second end ring capacitance is in an open circuit state, or the redundant impedance circuit and the redundant RF line form a third equivalent inductance, and the third equivalent inductance and the third end ring capacitance form resonance, so that the third end ring capacitance is in an open circuit state.

In another embodiment, the RF coil tuning/detuning circuit has the first impedance circuit has an inductance, and the electrical length of the first RF line is an integer multiple of a half-wavelength corresponding to a resonant frequency of the RF coil, or the first impedance circuit has a capacitance, and the electrical length of the first RF line is an integer multiple of a quarter-wavelength corresponding to a resonant frequency of the RF coil, or the second impedance circuit has an inductance, and the electrical length of the second RF line is an integer multiple of a half-wavelength corresponding to a resonant frequency of the RF coil, or the second impedance circuit has a capacitance, and the electrical length of the second RF line is an integer multiple of a quarter-wavelength corresponding to a resonant frequency of the RF coil, or the redundant impedance circuit has an inductance, and the electrical length of the redundant RF line is an integer multiple of a half-wavelength corresponding to a resonant frequency of the RF coil, or the redundant impedance circuit has a capacitance, and the electrical length of the redundant RF line is an integer multiple of a quarter-wavelength corresponding to a resonant frequency of the RF coil.

In another embodiment, the RF coil tuning/detuning circuit has a switch element, connected to a rung of the RF coil.

In another embodiment, the switch element is a power diode, and/or the RF coil is one of a body coil, a neck coil, a head coil, a spine coil, a surface coil, a combined head/neck coil.

The present invention also encompasses an RF coil detuning method having the steps of, when an RF coil needs to be detuned, removing a connection between a first input end of a first port and an RF power source, and retaining a connection between a first guide leg end of the first port and the RF coil, and connecting, via a first RF line, the first input end of the first port to a first impedance circuit arranged independently of the RF power source.

In an embodiment, the method also includes when the RF coil needs to transmit an RF pulse signal, removing the connection between the first input end of the first port and the first impedance circuit, and retaining the connection between the first guide leg end of the first port and the RF coil, and connecting the first input end of the first port to the RF power source via the first RF line.

In another embodiment, the first impedance circuit has an inductance, and the electrical length of the first RF line is an integer multiple of a half-wavelength corresponding to a resonant frequency of the RF coil, or the first impedance circuit has a capacitance, and the electrical length of the first RF line is an integer multiple of a quarter-wavelength corresponding to a resonant frequency of the RF coil.

It can be seen from the technical solution above that an RF coil tuning/detuning structure includes an RF power source, a first impedance circuit, a first RF line, and a first port having a first guide leg end and a first input end, with the first guide leg end being connected to a first end ring capacitance of the RF coil. When the RF coil needs to transmit an RF pulse signal, the first input end is connected to the RF power source via the first RF line. When the RF coil needs to be detuned, the first input end is connected to the first impedance circuit via the first RF line. No switch element needs to be provided for the RF coil in the present invention. Instead, the RF coil is connected to the impedance circuit by the RF line to change the overall electrical structure of the RF coil, thereby achieving a detuning effect. Thus, the present invention can reduce the need for a switch element to be provided, and thereby reduce costs, and can also avoid the harm resulting from breakdown of a switch element.

In an embodiment of the present invention, an impedance circuit is combined with a switch element to realize detuning jointly, and a good detuning effect can be achieved by a small number of switch elements.

Moreover, in an embodiment of the present invention, switching between a resonant state and a detuned state of the RF coil can be achieved by switching the RF line by plugging and unplugging. Furthermore, in an embodiment of the present invention, the impedance circuit and RF line are matched so as to exhibit an inductance characteristic to form resonance with an end ring capacitance, so that the end ring capacitance is in an open circuit state, thereby realizing detuning.

BRIEF DESCRIPTION OF THE DRAWINGS

FIG. 7 is a flowchart of an RF coil detuning method according to the present invention.

DESCRIPTION OF THE PREFERRED EMBODIMENTS

The present invention is explained in further detail below in conjunction with the accompanying drawings and embodiments, to clarify the technical solution and advantages thereof. It should be understood that the particular embodiments described here are merely intended to explain the present invention elaboratively, not to define the scope of protection thereof.

The solution of the present invention is expounded below by describing a number of representative embodiments, in order to make the description concise and intuitive. The large number of details in the embodiments are merely intended to assist with understanding of the solution of the present invention. However, obviously, the technical solution of the present invention need not be limited to these details when implemented. To avoid making the solution of the present invention confused unnecessarily, some embodiments are not described meticulously, but merely outlined. Hereinbelow, "comprises" means "including but not limited to", while "according to . . . " means "at least according to . . . , but not limited to only according to . . . ". In line with the linguistic customs of Chinese, in cases where the quantity of a component is not specified hereinbelow, this means that there may be one or more of the component; this may also be interpreted as meaning at least one.

Figure 1:
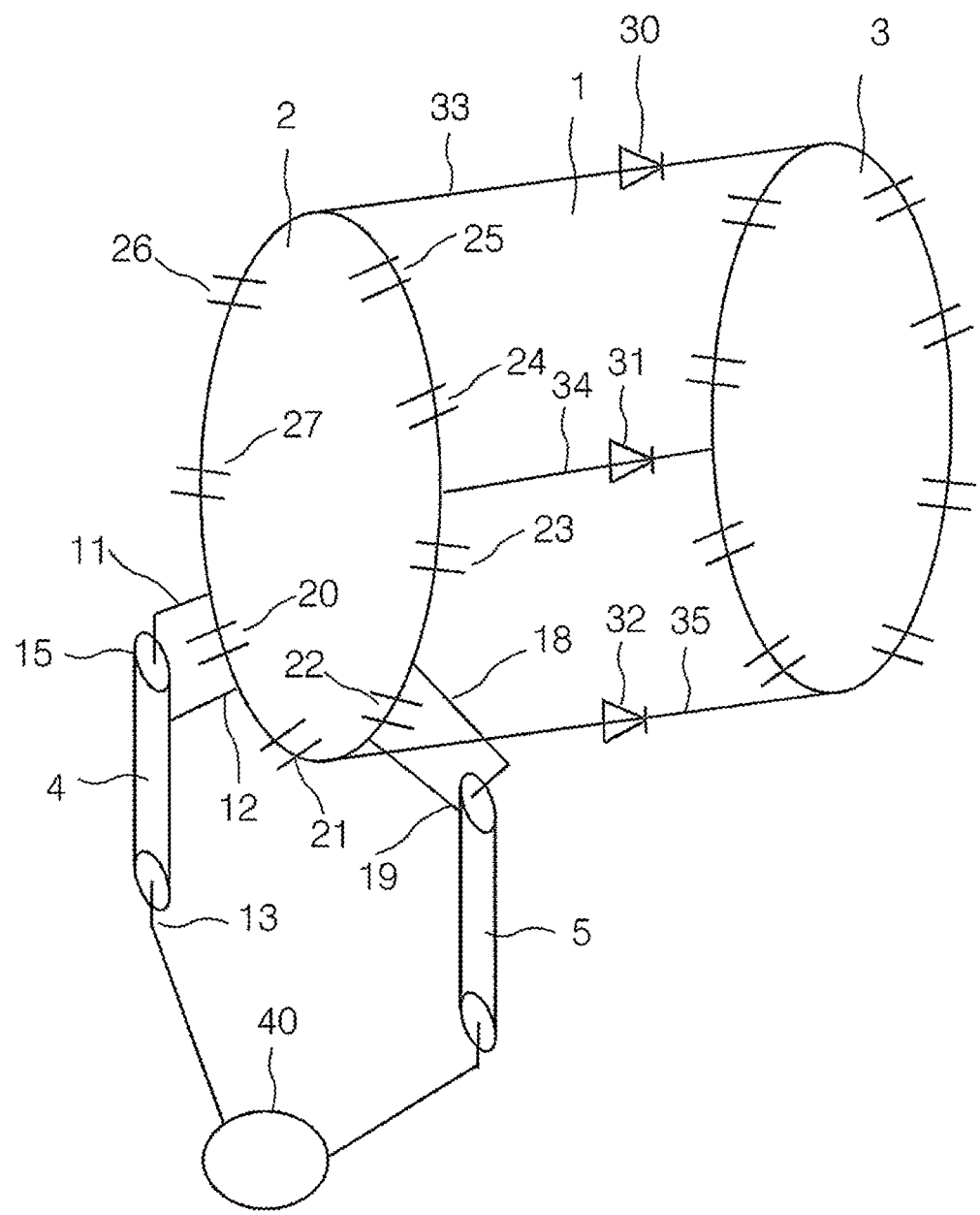
FIG. 1 is a schematic diagram of an RF coil tuning/detuning circuit in the prior art.

FIG. 1 is a schematic diagram of an RF coil tuning/detuning circuit in the prior art. In FIG. 1, a body coil is taken as an example to demonstratively explain shortcomings of the RF coil tuning/detuning structure in the prior art.

The meaning of tuning is to cause an RF coil to be in a resonant state, and the meaning of detuning is to cause an RF coil to depart from a resonant state.

As shown in FIG. 1, the circuit includes a coil body 1 and two end rings located at two sides of the coil body 1, specifically an end ring 2 and an end ring 3. The end ring 2 and end ring 3 each have 8 end ring capacitance positions arranged at equal intervals thereon, with an end ring capacitance arranged at each end ring capacitance position. The end ring capacitance values at the various end ring capacitance positions may be equal or different. Taking end ring 2 as an example, an end ring capacitance position 20, an end ring capacitance position 21, an end ring capacitance position 22, an end ring capacitance position 23, an end ring capacitance position 24, an end ring capacitance position 25, an end ring capacitance position 26 and an end ring capacitance position 27 are included on the end ring. The end ring capacitance position 20, end ring capacitance position 21, end ring capacitance position 22, end ring capacitance position 23, end ring capacitance position 24, end ring capacitance position 25, end ring capacitance position 26 and end ring capacitance position 27 each have an end ring capacitance arranged thereon.

A rung 33, a rung 34 and a rung 35 are provided on the coil body 1 of the body coil. A port structure of the body coil comprises two ports, specifically a port 4 and a port 5 which are connected to the end ring 2. The port 4 and port 5 have the same structure. Taking port 4 as an example, an input end 13 of port 4 is connected to a power input source 40, and a pin end 15 of port 4 has two legs, specifically a leg 11 and a leg 12. Similarly, an input end of port 5 is connected to the power input source 40, and a pin end of port 5 likewise has two legs, specifically a leg 18 and a leg 19. The two legs of port 4 span an end ring capacitance position on end ring 2, and the two legs of port 5 span an end ring capacitance position on end ring 2. In FIG. 1, leg 11 and leg 12 of port 4 span an end ring capacitance in end ring capacitance position 20, and leg 18 and leg 19 of port 5 span an end ring capacitance in end ring capacitance position 22.

When the body coil needs to transmit an RF pulse, the body coil is in a resonant state, and is thereby able to transmit the RF pulse with high efficiency.

When a local coil of the MRI system needs to receive a magnetic resonance signal, the body coil must be set to a detuned state, to prevent interference to the signal receiving operation of the local coil. At this time, a high-power diode 30 is arranged on rung 33 of the body coil, a high-power diode 31 is arranged on rung 34 of the body coil, and a high-power diode 32 is arranged on rung 35 of the body coil. By controlling the connection state or cutoff state of the high-power diode 30, high-power diode 31 or high-power diode 32, the overall electrical structure of the body coil can be changed, and the natural resonant frequency of the body coil can thereby be changed, such that the body coil departs from the original resonant state (i.e. a detuning effect is achieved), thereby preventing the body coil from causing interference to the signal receiving operation of the local coil.

Clearly, the detuning scheme in the prior art requires a number of high-power diodes to be arranged on the body coil. However, the price of high-power diodes is high, and this will give rise to a cost problem. In addition, subjecting a high-power diode to frequent connection or cutoff operations could also lead to breakdown of the high-power diode.

Shortcomings of an RF coil detuning structure in the prior art have been analysed above, taking a body coil as an example. In fact, other RF coils such as head coils, neck coils and spine coils must all be provided with their own switching elements such as high-power diodes in order to achieve detuning, and so all have the same shortcomings.

In an embodiment of the present invention, no switch element is provided on an RF coil; instead, the RF coil is connected to an impedance circuit by means of an RF line to change the overall electrical structure of the RF coil, thereby achieving a detuning effect.

Figure 2:
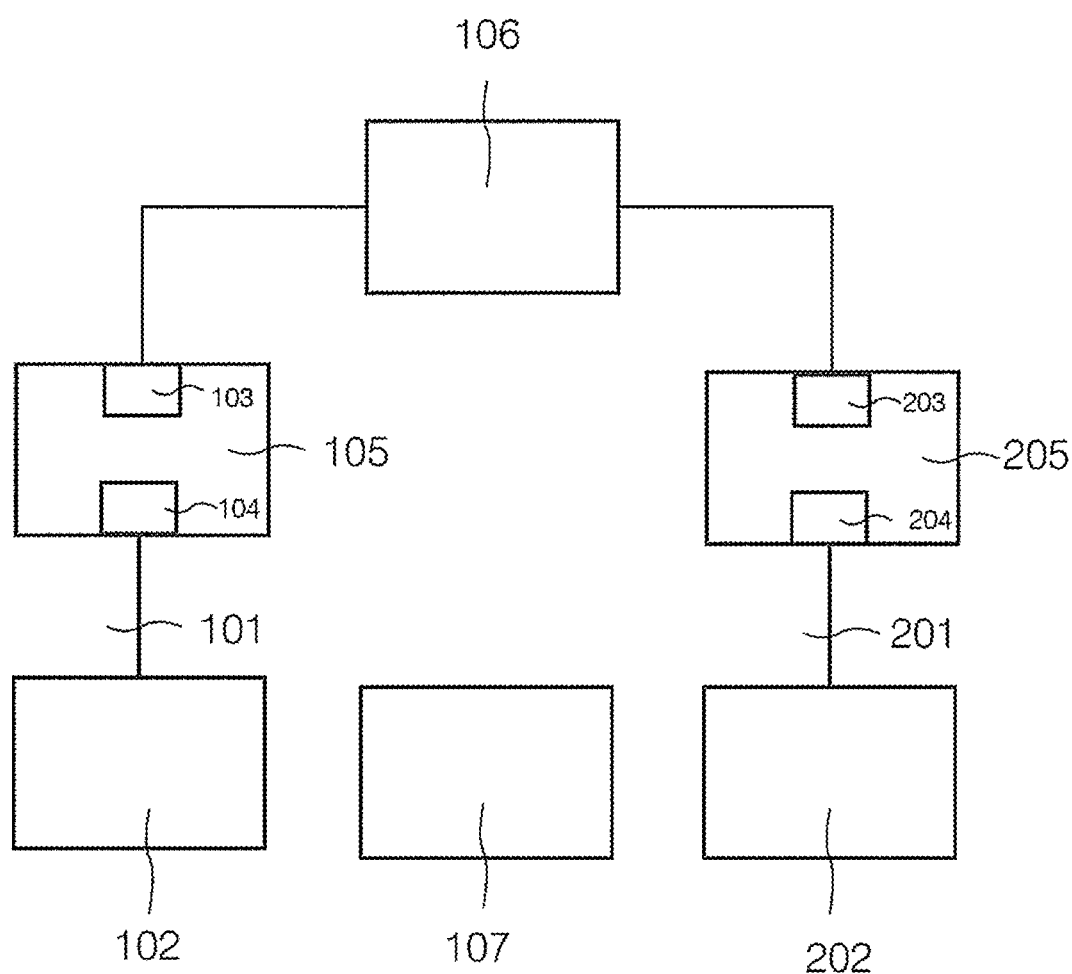
FIG. 2 is a schematic diagram of an RF coil tuning/detuning structure according to the present invention.

FIG. 2 is a schematic diagram of an RF coil tuning/detuning circuit according to the present invention.

As shown in FIG. 2, the tuning/detuning structure of the RF coil 106 has a first RF line 101, an RF power source 107, a first impedance circuit 102 that is independent of the RF power source 107, a first port 105 having a first guide leg end 103 and a first input end 104, wherein the first guide leg end 103 is connected to a first end ring capacitance of the RF coil 106.

When the RF coil 106 needs to transmit an RF pulse signal (i.e. enters a resonant state), the first input end 104 is connected to the RF power source 107 via the first RF line 101. When the RF coil 106 needs to be detuned, the first input end 104 is connected to the first impedance circuit 102 via the first RF line 101.

In this embodiment, once the first input end 104 has been connected to the RF power source 107 via the first RF line 101, the natural resonant frequency of the RF coil 106 is equal to a resonant frequency of the MRI system, thereby realizing resonance. Once the first input end 104 has been connected to the first impedance circuit 102 via the first RF line 101, the first impedance circuit 102 and the first RF line 101 form a first equivalent inductance; the first equivalent inductance and the first end ring capacitance of the RF coil 106 form resonance, so that the first end ring capacitance is in an open circuit state. Once the first end ring capacitance is in an open circuit state, the overall electrical structure of the RF coil 106 is changed; the intrinsic resonant frequency of the RF coil 106 changes, no longer being equal to a resonant frequency of the MRI system, therefore the RF coil 106 will not cause interference to the signal receiving operation of the local coil, i.e. detuning is realized.

Preferably, a detuning circuit of the RF coil 106 further has a second RF line 201, a second impedance circuit 202, and a second port 205 having a second guide leg end 203 and a second input end 204, wherein the second guide leg end 203 is connected to a second end ring capacitance of the RF coil.

Similarly, when the RF coil 106 needs to transmit an RF pulse signal (i.e. enters a resonant state), the second input end 204 is connected to the RF power source 107 via the second RF line 201. When the RF coil 106 needs to be detuned, the second input end 204 is connected to the second impedance circuit 202 via the second RF line 201.

In this embodiment, once the first input end 104 has been connected to the RF power source 107 via the first RF line 101, and the second input end 204 has been connected to the RF power source 107 via the second RF line 201, the natural resonant frequency of the RF coil 106 is equal to a resonant frequency of the MRI system, thereby realizing resonance. Once the second input end 204 has been connected to the second impedance circuit 202 via the second RF line 201, the second impedance circuit 202 and the second RF line 201 form a second equivalent inductance; the second equivalent inductance and the second end ring capacitance of the RF coil 206 form resonance, so that the second end ring capacitance is in an open circuit state.

Once the RF coil 106 has been further connected to the second impedance circuit 202 via the second RF line 201, the second end ring capacitance is also in an open circuit state, and the overall electrical structure of the RF coil 106 is changed further. Compared with the case where only the first impedance circuit 102 is connected to the RF coil 106 (only the first end ring capacitance is in an open circuit state), the natural resonant frequency of the RF coil 106 experiences a larger change, so the detuning effect can be optimized.

In order to better optimize the detuning effect, a detuning structure of the RF coil 106 may also have a redundant RF line, a redundant impedance circuit, and a redundant port comprising a redundant guide leg end and a redundant input end, wherein the redundant guide leg end is connected to a third end ring capacitance in the RF coil 106, and the redundant input end is connected to the redundant impedance circuit via the redundant RF line.

Once the redundant input end has been connected to the redundant impedance circuit via the redundant RF line, the redundant impedance circuit and the redundant RF line form a third equivalent inductance; the third equivalent inductance and the third end ring capacitance of the RF coil form resonance, so that the third end ring capacitance is in an open circuit state. Compared with the case where only the first impedance circuit 102 and the second impedance circuit 202 are connected to the RF coil 106 (only the first end ring capacitance and the second end ring capacitance are in an open circuit state), the natural resonant frequency of the RF coil 106 experiences a larger change, so the detuning effect can be optimized.

Preferably, there may be more than one redundant RF line, and there may also be more than one redundant impedance circuit corresponding to the redundant RF line(s).

In another embodiment, the first impedance circuit, second impedance circuit or redundant impedance circuit comprises at least one of the following elements: a resistance; an inductance; a capacitance. Specifically, the impedance of the impedance circuit is calculated in the following way: $Z=R+i(\omega L-1/(\omega C))$. Z is impedance, R is resistance, $\omega L$ is inductive reactance of the inductance, and $1/(\omega C)$ is capacitive reactance of the capacitance; i is an imaginary number.

In an embodiment, in the case of the first impedance circuit, second impedance circuit or redundant impedance circuit serving as an impedance circuit, when the impedance circuit comprises an inductance, the electrical length of the RF line connected to the impedance circuit is an integer multiple of a half-wavelength corresponding to a resonant frequency of the RF coil. In this case, the impedance circuit is matched to the RF line to exhibit an inductance characteristic. By adjusting an inductance value in the impedance circuit, an equivalent inductance exhibited by matching of the impedance circuit with the RF line can be changed, such that the equivalent inductance and the connected end ring capacitance form resonance, so that the connected end ring capacitance is in an open circuit state, to achieve an RF coil detuning effect.

In an embodiment, in the case of the first impedance circuit, second impedance circuit or redundant impedance circuit serving as an impedance circuit, when the impedance circuit comprises a capacitance, the electrical length of the RF line connected to the impedance circuit is an integer multiple of a quarter-wavelength corresponding to a resonant frequency of the RF coil. In this case, the impedance circuit is matched to the RF line to exhibit an inductance characteristic. By adjusting a capacitance value in the impedance circuit, an equivalent inductance exhibited by matching of the impedance circuit with the RF line can be changed, such that the equivalent inductance and the connected end ring capacitance form resonance, so that the connected end ring capacitance is in an open circuit state, to achieve an RF coil detuning effect.

Specifically: (1), when the first impedance circuit 102 comprises an inductance, the electrical length of the first RF line 101 is an integer multiple of a half-wavelength corresponding to a resonant frequency of the RF coil 106; (2), when the first impedance circuit 102 comprises a capacitance, the electrical length of the first RF line 101 is an integer multiple of a quarter-wavelength corresponding to a resonant frequency of the RF coil 106; (3), when the second impedance circuit 202 comprises an inductance, the electrical length of the second RF line 201 is an integer multiple of a half-wavelength corresponding to a resonant frequency of the RF coil 106; (4), when the second impedance circuit 202 comprises a capacitance, the electrical length of the second RF line 201 is an integer multiple of a quarter-wavelength corresponding to a resonant frequency of the RF coil 106; (5), when the redundant impedance circuit comprises an inductance, the electrical length of the redundant RF line is an integer multiple of a half-wavelength corresponding to a resonant frequency of the RF coil 106; and (6), when the redundant impedance circuit comprises a capacitance, the electrical length of the redundant RF line is an integer multiple of a quarter-wavelength corresponding to a resonant frequency of the RF coil 106.

Figure 3:
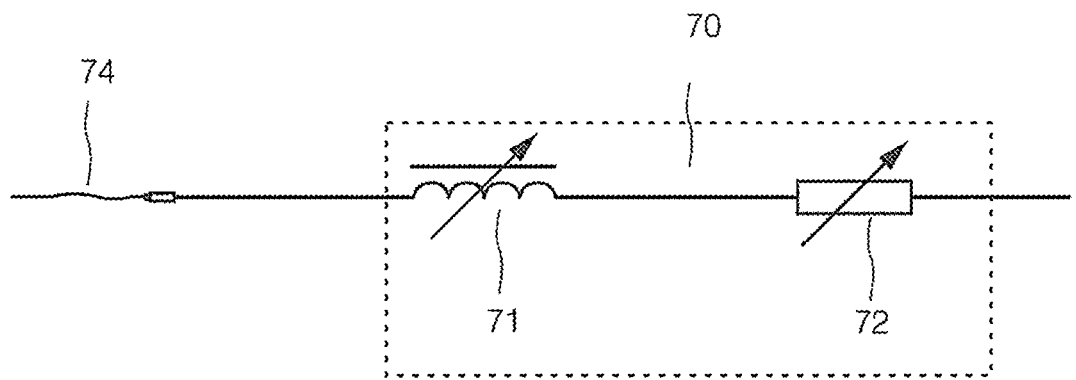
FIG. 3 is a first structural illustration of the connection of an impedance circuit and an RF line according to the present invention.

FIG. 3 is a first illustration of an impedance circuit and an RF line according to the present invention.

As shown in FIG. 3, the impedance circuit 70 has an adjustable inductance 71, and preferably also comprises an adjustable resistance 72 (for protecting the impedance circuit). The electrical length of an RF line 74 is an integer multiple of a half-wavelength corresponding to a resonant frequency of the RF coil. The impedance circuit 70 is connected to the RF line 74, to form an inductance characteristic. Adjusting the adjustable inductance 71 causes a connected end ring capacitance and an equivalent inductance value of the impedance circuit 70 to form resonance, so that the connected end ring capacitance is in an open circuit state.

Figure 4:
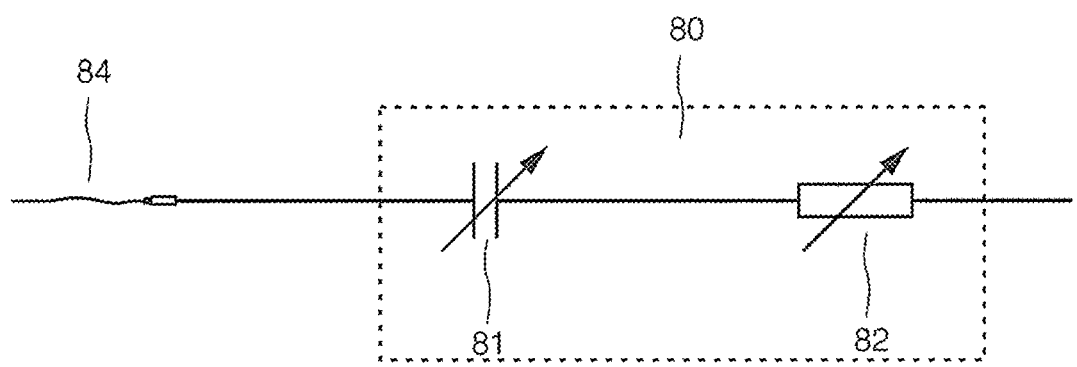
FIG. 4 is a second structural illustration of the connection of an impedance circuit and an RF line according to the present invention.

FIG. 4 is a second illustration of the connection of an impedance circuit and an RF line according to the present invention.

As shown in FIG. 4, the impedance circuit 80 comprises an adjustable capacitance 81, and preferably also comprises an adjustable resistance 82 (for protecting the impedance circuit). The electrical length of an RF line 84 is an integer multiple of a quarter-wavelength corresponding to a resonant frequency of the RF coil. The impedance circuit 80 is connected to the RF line 84, to form an inductance characteristic. Adjusting the adjustable capacitance 81 causes a connected end ring capacitance and an equivalent inductance value of the impedance circuit 80 to form resonance, so that the connected end ring capacitance is in an open circuit state.

The first impedance circuit 102, second impedance circuit 202 or redundant impedance circuit of FIG. 2 may be specifically implemented as the impedance circuit 70 in FIG. 3. Moreover, the first impedance circuit 102, second impedance circuit 202 or redundant impedance circuit of FIG. 2 may also be specifically implemented as the impedance circuit 80 in FIG. 4.

Specific versions of the impedance circuit have been described above. Those skilled in the art will realize that such a description is purely demonstrative, and not intended to define the scope of protection of embodiments of the present invention.

In an embodiment, a detuning structure of the RF coil 106 also comprises: a switch element, connected to a rung of the RF coil 106. By using a control signal to control the connection or cutoff of the switch element, the electrical structure of the RF coil 106 can be changed further. Preferably, the switch element is a power diode.

In an embodiment of the present invention a switch element may also be disposed on a rung of the RF coil, and by adjusting a connection state or cutoff state of the switch element, the overall electrical structure of the RF coil can be changed further, thereby changing the natural resonant frequency of a body coil more notably. In other words, an embodiment of the present invention may also combine an impedance circuit with a switch element in order to realize detuning jointly. When a detuning structure of the RF coil 106 comprises an impedance circuit, a good detuning effect can be achieved by a small number of switch elements.

Specifically, the RF coil 106 has at least one of the following: body coil; neck coil; head coil; spine coil, surface coil; combined head/neck coil, etc. Preferably, the RF coil 106 is implemented as a birdcage transmit coil, and the guide leg end of the port spans an end ring capacitance position on an end ring of the birdcage transmit coil.

Typical examples of the RF coil of the present invention have been described above. Those skilled in the art will realize that such a description is purely demonstrative, and not intended to define the scope of protection of embodiments of the present invention.

RF coil tuning/detuning in embodiments of the present invention is described in detail below with reference to examples and specific drawings.

Figure 5:
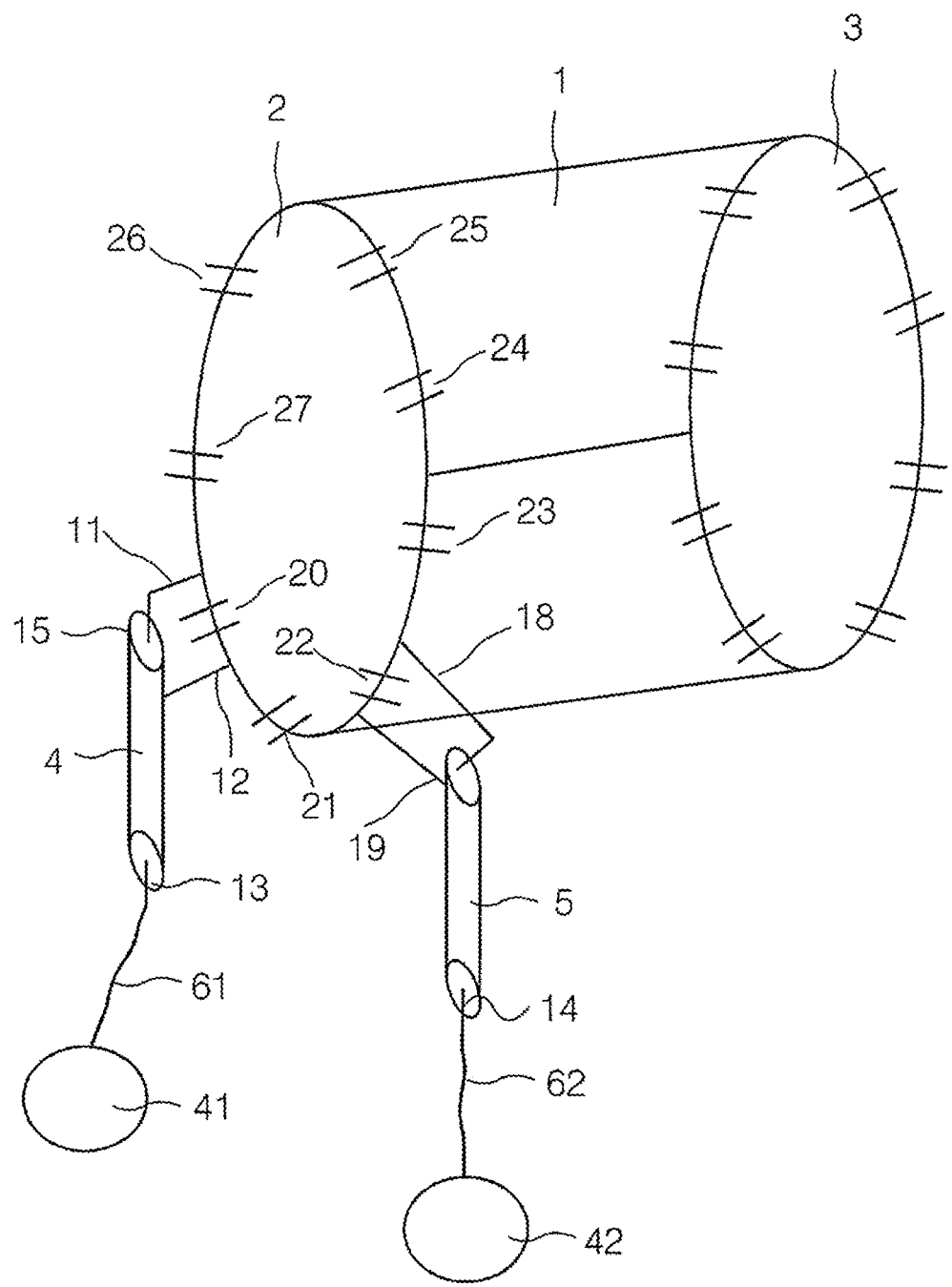
FIG. 5 is a schematic illustration of an RF coil tuning/detuning structure according to a first embodiment of the present invention.

FIG. 5 is a demonstrative schematic diagram of an RF coil tuning/detuning structure according to a first embodiment of the present invention. In FIG. 5, a body coil is shown as an example.

As shown in FIG. 5, the body coil has a coil body 1 and two end rings located at two sides of the coil body 1, specifically an end ring 2 and an end ring 3. The end ring 2 and end ring 3 each have 8 end ring capacitance positions arranged at substantially equal intervals thereon, with an end ring capacitance arranged at each end ring capacitance position. The end ring capacitance values at the various end ring capacitance positions may be equal or different. Taking end ring 2 as an example for illustration, end ring 2 comprises an end ring capacitance position 20, an end ring capacitance position 21, an end ring capacitance position 22, an end ring capacitance position 23, an end ring capacitance position 24, an end ring capacitance position 25, an end ring capacitance position 26 and an end ring capacitance position 27. The end ring capacitance position 20, end ring capacitance position 21, end ring capacitance position 22, end ring capacitance position 23, end ring capacitance position 24, end ring capacitance position 25, end ring capacitance position 26 and end ring capacitance position 27 each have an end ring capacitance arranged thereon. Similarly, end ring 3 has a similar structure, which is not described superfluously here.

The structure also has two ports, specifically a port 4 and a port 5. The port 4 and port 5 have the same structure. When the body coil transmits an RF pulse, the body coil is in a resonant state, and so transmits the RF pulse with high efficiency. At this time, an input end 13 of port 4 is connected to a power input source (not shown in FIG. 5), and a pin end 15 of port 4 has two legs, specifically a leg 11 and a leg 12. Similarly, an input end of port 5 is connected to a power input source (not shown in FIG. 5), and a pin end of port 5 likewise has two legs, specifically a leg 18 and a leg 19. Port 4 and port 5 are both connected to end ring 2. Leg 11 and leg 12 of port 4 span end ring capacitance position 20, and leg 18 and leg 19 of port 5 span end ring capacitance position 22.

When a local coil of the MRI system needs to receive a magnetic resonance signal, the body coil must be set to a detuned state, to prevent interference to the signal receiving operation of the local coil. At this time, the connection between the input end 13 of port 4 and the power input source is removed, and the connection between the input end 14 of port 5 and the power input source is removed. Moreover, the input end 13 of port 4 is connected to an impedance circuit 41 via an RF line 61, and the input end 14 of port 5 is connected to an impedance circuit 42 via an RF line 62. Impedance circuit 41 is matched to RF line 61 so as to form an inductance characteristic; end ring capacitance 20 and an equivalent inductance of the inductance characteristic form resonance, so that end ring capacitance 20 is in an open circuit state. Impedance circuit 42 is matched to RF line 62 so as to form an inductance characteristic; end ring capacitance 22 and an equivalent inductance of the inductance characteristic form resonance, so that end ring capacitance 22 is in an open circuit state.

Through the abovementioned settings, the overall electrical structure of the body coil has already been changed as compared with when an RF pulse is transmitted; the natural resonant frequency of the body coil changes, no longer being equal to a resonant frequency of the MRI system, and so will not cause interference to a signal receiving operation of a local coil.

In the example above, the case where 8 end ring capacitance positions are arranged on the end ring is taken as an example for illustration. In practice, the specific number of end ring capacitance positions on the end ring can be adjusted; no restrictions are imposed in this respect in embodiments of the present invention.

Figure 6:
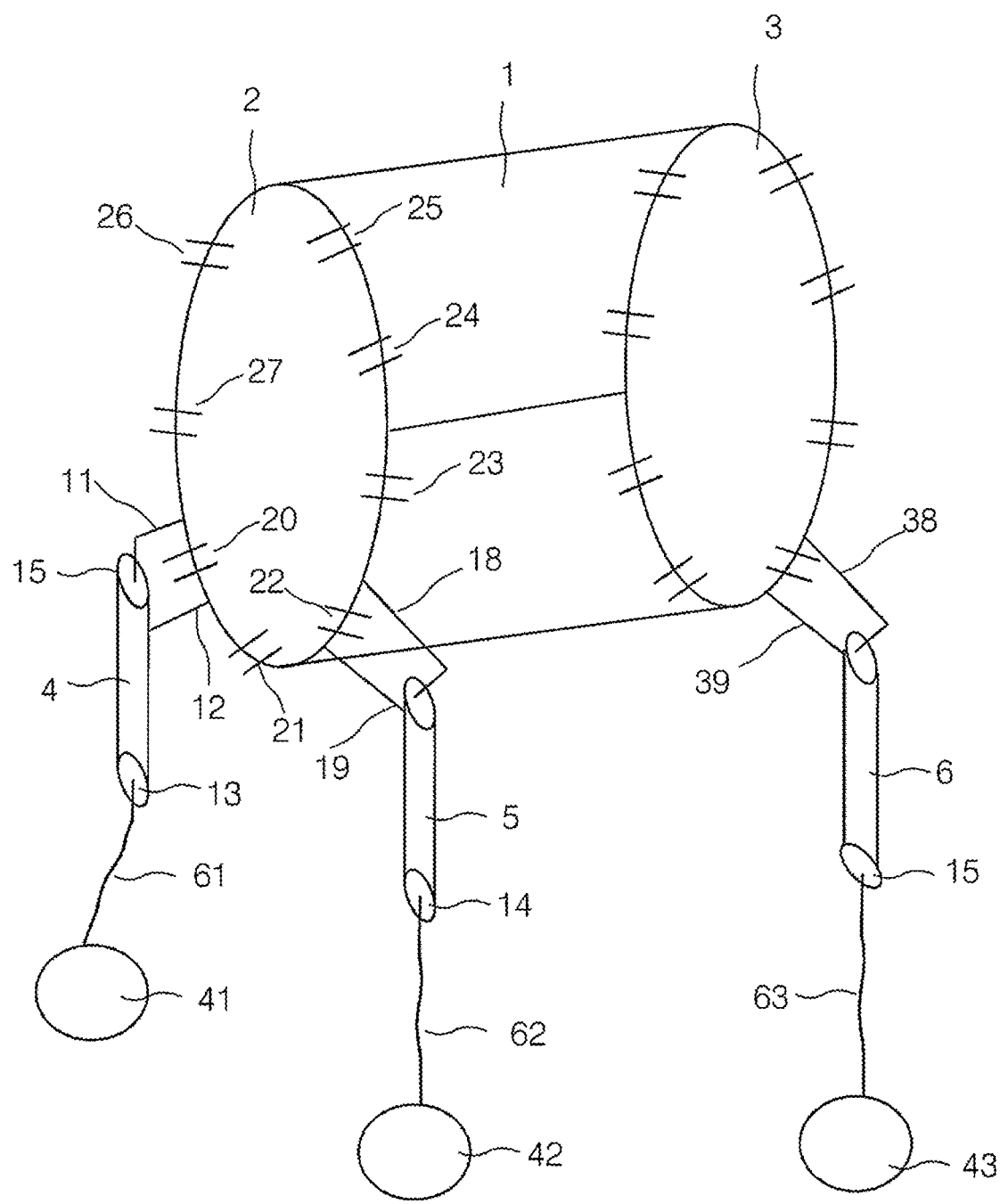
FIG. 6 is a schematic illustration of an RF coil tuning/detuning structure according to a second embodiment of the present invention.

FIG. 6 is a circuit diagram of an RF coil tuning/detuning structure according to a second embodiment of the present invention, again using a body coil as an example.

As shown in FIG. 6, the body coil has a coil body 1 and two end rings located at two sides of the coil body 1, specifically an end ring 2 and an end ring 3. The end ring 2 and end ring 3 each have 8 end ring capacitance positions arranged at substantially equal intervals thereon, with an end ring capacitance arranged at each end ring capacitance position. The end ring capacitance values at the various end ring capacitance positions may be equal or different. Taking end ring 2 as an example for illustration, end ring 2 comprises an end ring capacitance position 20, an end ring capacitance position 21, an end ring capacitance position 22, an end ring capacitance position 23, an end ring capacitance position 24, an end ring capacitance position 25, an end ring capacitance position 26 and an end ring capacitance position 27. The end ring capacitance position 20, end ring capacitance position 21, end ring capacitance position 22, end ring capacitance position 23, end ring capacitance position 24, end ring capacitance position 25, end ring capacitance position 26 and end ring capacitance position 27 each have an end ring capacitance arranged thereon. Similarly, end ring 3 has a similar structure, which is not described superfluously here.

The structure also has two ports, specifically a port 4 and a port 5. The port 4 and port 5 have the same structure. When the body coil transmits an RF pulse, the body coil is in a resonant state, and so transmits the RF pulse with high efficiency. At this time, an input end 13 of port 4 is connected to a power input source (not shown in FIG. 6), and a pin end 15 of port 4 has two legs, specifically a leg 11 and a leg 12. Similarly, an input end of port 5 is connected to a power input source (not shown in FIG. 6), and a pin end of port 5 likewise has two legs, specifically a leg 18 and a leg 19. Port 4 and port 5 are both connected to end ring 2. Leg 11 and leg 12 of port 4 span end ring capacitance position 20, and leg 18 and leg 19 of port 5 span end ring capacitance position 22.

When a local coil of the MRI system needs to receive a magnetic resonance signal, the body coil must be set to a detuned state, to prevent interference to the signal receiving operation of the local coil. At this time, the connection between the input end 13 of port 4 and the power input source is removed, and the connection between the input end 14 of port 5 and the power input source is removed. Moreover, the input end 13 of port 4 is connected to an impedance circuit 41 via an RF line 61, and the input end 14 of port 5 is connected to an impedance circuit 42 via an RF line 62. Impedance circuit 41 is matched to RF line 61 so as to form an inductance characteristic; end ring capacitance 20 and an equivalent inductance of the inductance characteristic form resonance, so that end ring capacitance 20 is in an open circuit state. Impedance circuit 42 is matched to RF line 62 so as to form an inductance characteristic; end ring capacitance 22 and an equivalent inductance of the inductance characteristic form resonance, so that end ring capacitance 22 is in an open circuit state.

In order to achieve a better detuning effect, a port 6 is further connected on end ring 3. A leg 38 and a leg 39 of port 6 span an end ring capacitance position of end ring 3. An input end 15 of port 6 is connected to an impedance circuit 43 via a redundant RF line 63. Port 6 is a redundant port, additionally provided in order to achieve a better detuning effect. Impedance circuit 43 is matched to RF line 63 so as to form an inductance characteristic; an end ring capacitance spanned by leg 38 and leg 39 and an equivalent inductance of the inductance characteristic form resonance, so that the end ring capacitance is in an open circuit state.

Through the abovementioned settings, the overall electrical structure of the body coil has already been notably changed as compared with when an RF pulse is transmitted; the natural resonant frequency of the body coil changes, no longer being equal to a resonant frequency of the MRI system, and so the body coil will not cause interference to a signal receiving operation of a local coil.

In the example above, the case where 8 end ring capacitance positions are arranged on the end ring is taken as an example for illustration. In practice, the specific number of end ring capacitance positions on the end ring can be adjusted; no restrictions are imposed in this respect in embodiments of the present invention.

Based on the description above, an embodiment of the present invention also proposes an RF coil detuning method.

FIG. 7 is a flowchart of an RF coil detuning method according to an embodiment of the present invention.

As FIG. 7 shows, the method includes the following steps:

Step 701: when an RF coil needs to be detuned, removing a connection between a first input end of a first port and an RF power source, and retaining a connection between a first guide leg end of the first port and the RF coil.

Step 702: connecting the first input end of the first port to a first impedance circuit via a first RF line.

Here, when the RF coil needs to be detuned, first of all the connection between the first port of the RF coil and the RF power source is removed, while retaining the connection between the first port of the RF coil and the RF coil. The first input end of the first port is then connected to the first impedance circuit via the first RF line, thereby changing the overall electrical structure of the RF coil to achieve a detuning effect.

In an embodiment, in step 701, the operation of removing the connection between the first input end of the first port and the RF power source when the RF coil needs to be detuned comprises: removing the connection between the first input end of the first port and the RF power source when a local coil acquires a magnetic resonance signal. In other words, when a local coil acquires a magnetic resonance signal, it is determined that the RF coil needs to enter a detuned state, at which time removal of the connection between the first input end of the first port and the RF power source begins.

In another embodiment, the method also includes:

Step 703: when the RF coil needs to transmit an RF pulse signal, removing the connection between the first input end of the first port and the first impedance circuit, and retaining the connection between the first guide leg end of the first port and the RF coil;

Step 704: connecting the first input end of the first port to the RF power source.

Here, when the RF coil needs to transmit an RF pulse signal, it is determined that the RF coil needs to enter a detuned state, at which time the connection between the first input end of the first port and the first impedance circuit is removed, the connection between the first guide leg end of the first port and the RF coil is retained, and the first input end of the first port is connected to the RF power source, thereby restoring the overall electrical structure of the RF coil to a resonant state.

In an embodiment, the first impedance circuit comprises an inductance, and the electrical length of the first RF line is an integer multiple of a half-wavelength corresponding to a resonant frequency of the RF coil; or the first impedance circuit comprises a capacitance, and the electrical length of the first RF line is an integer multiple of a quarter-wavelength corresponding to a resonant frequency of the RF coil.

In summary, the present invention is an RF coil tuning/detuning structure, having an RF power source, a first impedance circuit, a first RF line, and a first port having a first guide leg end and a first input end, with the first guide leg end being connected to a first end ring capacitance of the RF coil. When the RF coil needs to transmit an RF pulse signal, the first input end is connected to the RF power source via the first RF line. When the RF coil needs to be detuned, the first input end is connected to the first impedance circuit via the first RF line. No switch element needs to be provided on the RF coil in an embodiment of the present invention. Instead, the RF coil is connected to the impedance circuit by the RF line to change the overall electrical structure of the RF coil, thereby achieving a detuning effect. Thus, the present invention avoids the need for a switch element, and thereby reduces costs, and can also avoid the harm resulting from breakdown of a switch element.

In an embodiment of the present invention, an impedance circuit is combined with a switch element to realize detuning jointly, and a good detuning effect can be achieved by a small number of switch elements.

Moreover, in an embodiment of the present invention, switching between a resonant state and a detuned state of the RF coil can be achieved by switching the RF line by plugging and unplugging. Furthermore, in an embodiment of the present invention, the impedance circuit and RF line are matched so as to exhibit an inductance characteristic to form resonance with an end ring capacitance, so that the end ring capacitance is in an open circuit state, thereby realizing detuning.

Although modifications and changes may be suggested by those skilled in the art, it is the intention of the Applicant to embody within the patent warranted hereon all changes and modifications as reasonably and properly come within the scope of the Applicant's contribution to the art.

The invention claimed is:

1. An RF coil tuning/detuning circuit, comprising:
   an RF power source;
   a first impedance circuit, arranged independently of the RF power source;
   a first RF line;
   a first port comprising a first guide leg end and a first input end, with the first guide leg end being connected to a first end ring capacitance of the RF coil;
   when the RF coil needs to transmit an RF pulse signal, the first input end is connected to the RF power source via the first RF line; when the RF coil needs to be detuned, the first input end is connected to the first impedance circuit via the first RF line;
   a second RF line;
   a second impedance circuit;
   a second port comprising, a second guide lee end and a second input end, with the second guide leg end being connected to a second end ring capacitance of the RF coil;
   when the RF coil needs to transmit an RF pulse signal, the second input end is connected to the RF power source via the second RF line; when the RF could needs to be detuned, the second input end is connected to the second impedance circuit via the second RF line;

a redundant RF line;

a redundant impedance circuit;

a redundant port comprising a redundant guide lee end and a redundant input end;

when the RF coil needs to be detuned, the redundant guide leg end is connected to a third end ring capacitance in the RF coil, and the redundant input end is connected to the redundant impedance circuit via the redundant RF line;

wherein:

the first impedance circuit and the first RF line form a first equivalent inductance, and the first equivalent inductance and the first end ring capacitance form resonance, so that the first end right capacitance is in an open circuit state; or the second impedance circuit and the second RF line form a second equivalent inductance, and the second equivalent inductance and the second end ring capacitance form resonance, so that the second end ring capacitance is an open circuit state; or the redundant impedance circuit and the redundant RF line form a third equivalent inductance, and the third equivalent inductance and the third end ring capacitance form resonance, so that the third end ring capacitance is an open circuit state; and wherein:

the first impedance circuit comprises an inductance, and the electrical length of the first RF line is an integer multiple of a half-wavelength corresponding to a resonant frequency of the RF coil; or the first impedance circuit comprises a capacitance, and the electrical length of the first RF line is an integer multiple of a quarter-wavelength corresponding to a resonant frequency of the RF coil; or the second impedance circuit comprises an inductance, and the electrical length of the second RF line is an integer multiple of a half-wavelength corresponding to a resonant frequency of the RF coil; or the second impedance circuit comprises a capacitance, and the electrical length of the second RF line is an integer multiple of a quarter-wavelength corresponding to a resonant frequency of the RF coil; or the redundant impedance circuit comprises an inductance and the electrical length of the redundant RF line is an integer multiple of half-wavelength corresponding to a resonant frequency of the RF coil; or the redundant impedance circuit comprises a capacitance, and the electrical length of the redundant RF line is an integer multiple of a quarter-wavelength corresponding to a resonant frequency of the RF coil.

2. An RF coil detuning method, comprising:

when an RF coil needs to be detuned, removing a connection between a first input end of a first port and an RF power source, and retaining a connection between a first guide leg end of the first port and the RF coil; and connecting, via a first RF line, the first input end of the first port to a first impedance circuit arranged independently of the RF power source, wherein:

the first impedance circuit comprises an inductance, and the electrical length of the first RF line is integer multiple of a half-wavelength corresponding to a resonant frequency of the RE coil, or the first impedance circuit comprises a capacitance, and the electrical length of the first RF line is an integer multiple of a quarter-wavelength, corresponding to a resonant frequency of the RF coil.

3. The RF coil tuning/detuning structure as claimed in claim 1, comprising:

a switch element, connected to a rung of the RF coil.

4. The RF coil tuning/detuning structure as claimed in claim 3, wherein:

the switch element is a power diode; and/or the RF coil is one of a body coil, a neck coil, a head coil, a spine coil, a surface coil, a combined head/neck coil.

5. The RF coil detuning method as claimed in claim 2, comprising:

when the RF coil needs to transmit an RF pulse signal, removing the connection between the first input end of the first port and the first impedance circuit, and retaining the connection between the first guide leg end of the first port and the RF coil;

connecting the first input end of the first port to the RF power source via the first RF line.

* * * * *